(12) United States Patent
Pavlopoulos et al.

(10) Patent No.: US 12,733,164 B2
(45) Date of Patent: Sep. 8, 2026

(54) METHODS AND DEVICES FOR 3D NAND USING SILICON-AND-HALOGEN-CONTAINING MATERIALS

(71) Applicant: Applied Materials, Inc., Santa Clara, CA (US)

(72) Inventors: Dimitrios Pavlopoulos, Glendale, CA (US); Rui Cheng, San Jose, CA (US); Qinghua Zhao, Sunnyvale, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 758 days.

(21) Appl. No.: 17/705,135

(22) Filed: Mar. 25, 2022

(65) Prior Publication Data

US 2023/0309300 A1 Sep. 28, 2023

(51) Int. Cl.
*H10B 43/27* (2023.01)
*H10B 43/35* (2023.01)
(Continued)

(52) U.S. Cl.
CPC ............. *H10B 43/27* (2023.02); *H10B 43/35* (2023.02); *H10P 14/271* (2026.01); *H10P 14/3248* (2026.01); *H10P 14/6681* (2026.01)

(58) Field of Classification Search
CPC ....... H01L 21/02592; H01L 21/025208; H01L 21/0257; H01L 21/02502; H01B 43/27;
(Continued)

(56) References Cited

U.S. PATENT DOCUMENTS

2012/0021574 A1 1/2012 Lee et al.
2012/0241841 A1* 9/2012 Mizushima .......... H10D 64/037 257/E21.18
(Continued)

OTHER PUBLICATIONS

Application No. PCT/US2023/015447 , International Search Report and Written Opinion, Mailed On Jul. 4, 2023, 10 pages.
(Continued)

*Primary Examiner* — William B Partridge
*Assistant Examiner* — Heim Kirin Grewal
(74) *Attorney, Agent, or Firm* — Kilpatrick Townsend & Stockton LLP

(57) ABSTRACT

Exemplary semiconductor processing methods may include providing a silicon-containing precursor to a processing region of a semiconductor processing chamber. A substrate may be disposed within the processing region of the semiconductor processing chamber. Alternating layers of material may be formed on the substrate. One or more recesses may be formed in the alternating layers of material. The methods may include forming a first silicon-containing material. The first silicon-containing material may extend into the one or more recesses formed in the alternating layers of material. The methods may include providing a halogen-containing precursor to the processing region of the semiconductor processing chamber. The methods may include forming a silicon-and-halogen-containing material. The silicon-and-halogen-containing material may overly the first silicon-containing material. The methods may include forming a second silicon-containing material. The second silicon-containing material may overly the silicon-and-halogen-containing material.

18 Claims, 4 Drawing Sheets

(51) Int. Cl.
*H10P 14/20* (2026.01)
*H10P 14/60* (2026.01)

(58) Field of Classification Search
CPC ....... H10B 43/27; H10B 43/35; H10P 14/271; H10P 14/3248; H10P 14/6681
See application file for complete search history.

(56) References Cited

U.S. PATENT DOCUMENTS

| | | | | |
|---|---|---|---|---|
| 2012/0276702 | A1 | 11/2012 | Yang et al. | |
| 2016/0118396 | A1 | 4/2016 | Rabkin et al. | |
| 2018/0366554 | A1 | 12/2018 | Choi et al. | |
| 2018/0374863 | A1* | 12/2018 | Purayath | H10B 41/27 |
| 2019/0013404 | A1 | 1/2019 | Carlson et al. | |
| 2019/0371814 | A1* | 12/2019 | Yamasaka | H10B 43/27 |
| 2020/0194571 | A1* | 6/2020 | Cheng | H01L 21/28185 |
| 2021/0083064 | A1* | 3/2021 | Okada | H10B 43/30 |
| 2021/0143058 | A1* | 5/2021 | Jha | H01L 21/3105 |
| 2021/0249420 | A1* | 8/2021 | Seki | H10D 64/037 |
| 2021/0407789 | A1* | 12/2021 | Pierreux | H01L 21/0245 |
| 2022/0085066 | A1* | 3/2022 | Natori | H01L 29/40117 |
| 2023/0223266 | A1* | 7/2023 | Zhou | H10D 64/035<br>438/585 |

OTHER PUBLICATIONS

Korean Application No. 10-2024-7035132, Office Action mailed on Jan. 12, 2026, 21 pages (12 pages of English Translation and 9 pages of Original Document).

* cited by examiner

METHODS AND DEVICES FOR 3D NAND USING SILICON-AND-HALOGEN-CONTAINING MATERIALS

TECHNICAL FIELD

The present technology relates to semiconductor processes and materials. More specifically, the present technology relates to forming and processing memory holes in layered memory structures.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Subsequent depositions of layers of materials in the memory holes and treatments may be performed to form polycrystalline silicon channels. Material properties of the layers of materials may affect device performance, which may result in defects or reduced performance in final devices. As the number of alternating layers increase, continued innovation in 3D NAND technology is necessary to meet requirements for high string current and reduced variation in devices.

Thus, there is a need for improved systems and methods that can be used to produce high quality devices and structures. These and other needs are addressed by the present technology.

SUMMARY

Exemplary semiconductor processing methods may include providing a silicon-containing precursor to a processing region of a semiconductor processing chamber. A substrate may be disposed within the processing region of the semiconductor processing chamber. Alternating layers of material may be formed on the substrate. One or more recesses may be formed in the alternating layers of material. The methods may include forming a first silicon-containing material. The first silicon-containing material may extend into the one or more recesses formed in the alternating layers of material. The methods may include providing a halogen-containing precursor to the processing region of the semiconductor processing chamber. The methods may include forming a silicon-and-halogen-containing material. The silicon-and-halogen-containing material may overly the first silicon-containing material. The methods may include forming a second silicon-containing material. The second silicon-containing material may overly the silicon-and-halogen-containing material.

In some embodiments, a temperature within the semiconductor processing chamber may be maintained at less than or about 700° C. A pressure within the semiconductor processing chamber may be maintained at less than or about 300 Torr. The silicon-containing precursor may be or include silane, disilane, dichlorosilane, or trisilane. The halogen-containing precursor may include fluorine. The silicon-and-halogen-containing material may include a silicon-and-fluorine-containing material. The halogen-containing precursor may be or include nitrogen trifluoride or silicon tetrafluoride. The methods may include forming a first silicon-containing material prior to forming the silicon-and-halogen-containing material. The first silicon-containing material may extend into the one or more recesses formed in the alternating layers of material. The methods may include forming a second silicon-containing material. The second silicon-containing material may overly the silicon-and-halogen-containing material. The methods may include forming both the first silicon-containing material and the second silicon-containing material. The silicon-and-halogen-containing material may be characterized by a thickness less than or about 60 nm. The methods may include annealing the substrate subsequent forming the second silicon-containing material. A halogen material within the silicon-and-halogen-containing material may diffuse into the first silicon-containing material, the second silicon-containing material, or both during the annealing.

Some embodiments of the present technology may encompass semiconductor processing methods. The methods may include forming a first layer of material in one or more recesses defined in alternating layers of material on a substrate in a processing region of a semiconductor processing chamber. The first layer of material may be a first silicon-containing material. The methods may include forming a second layer of material on the first layer of material. The second layer of material may be a silicon-and-fluorine-containing material. The methods may include forming a third layer of material on the second layer of material. The third layer of material may be a second silicon-containing material.

In some embodiments, a temperature within the semiconductor processing chamber may be maintained at less than or about 700° C. A pressure within the semiconductor processing chamber may be maintained at less than or about 300 Torr. The alternating layers of material may include alternating layers of oxide material and nitride material. The substrate may include greater than 16 alternating layers of material. The second layer of material may be characterized by a thickness greater than a thickness of the first layer of material and the third layer of material. The second layer of material may be characterized by a thickness of between about 2 nm and about 30 nm. The methods may include annealing the substrate subsequent forming the first layer of material, the second layer of material, and the third layer of material. The first layer of material, the third layer of material, or both may include amorphous silicon. The annealing may cause at least a portion of the amorphous silicon to transition to a polycrystalline silicon. The methods may include, subsequent to annealing the substrate, removing a portion of the first silicon-containing material, the silicon-and-halogen-containing material, and the second silicon-containing material.

Some embodiments of the present technology encompass semiconductor structures. The structures may include a substrate having alternating layers of material are formed on the substrate. One or more recesses may be formed in the alternating layers of material. The structures may include a polycrystalline silicon material extending into the one or more recesses. A second surface of polycrystalline material opposite a first surface of the polycrystalline silicon material may overly the alternating layers of material. The polycrystalline silicon material may include a halogen. A portion of the polycrystalline silicon material disposed midway between the first surface and second surface may have a higher halogen atomic concentration compared to the first surface and the second surface.

In some embodiments, the polycrystalline silicon material is characterized by a thickness of less than or about 30 nm.

Such technology may provide numerous benefits over conventional systems and techniques. For example, the processes and structures may improve polycrystalline silicon channel formation. Additionally, the operations of embodiments of the present technology may increase electrical performance of final devices or structures. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
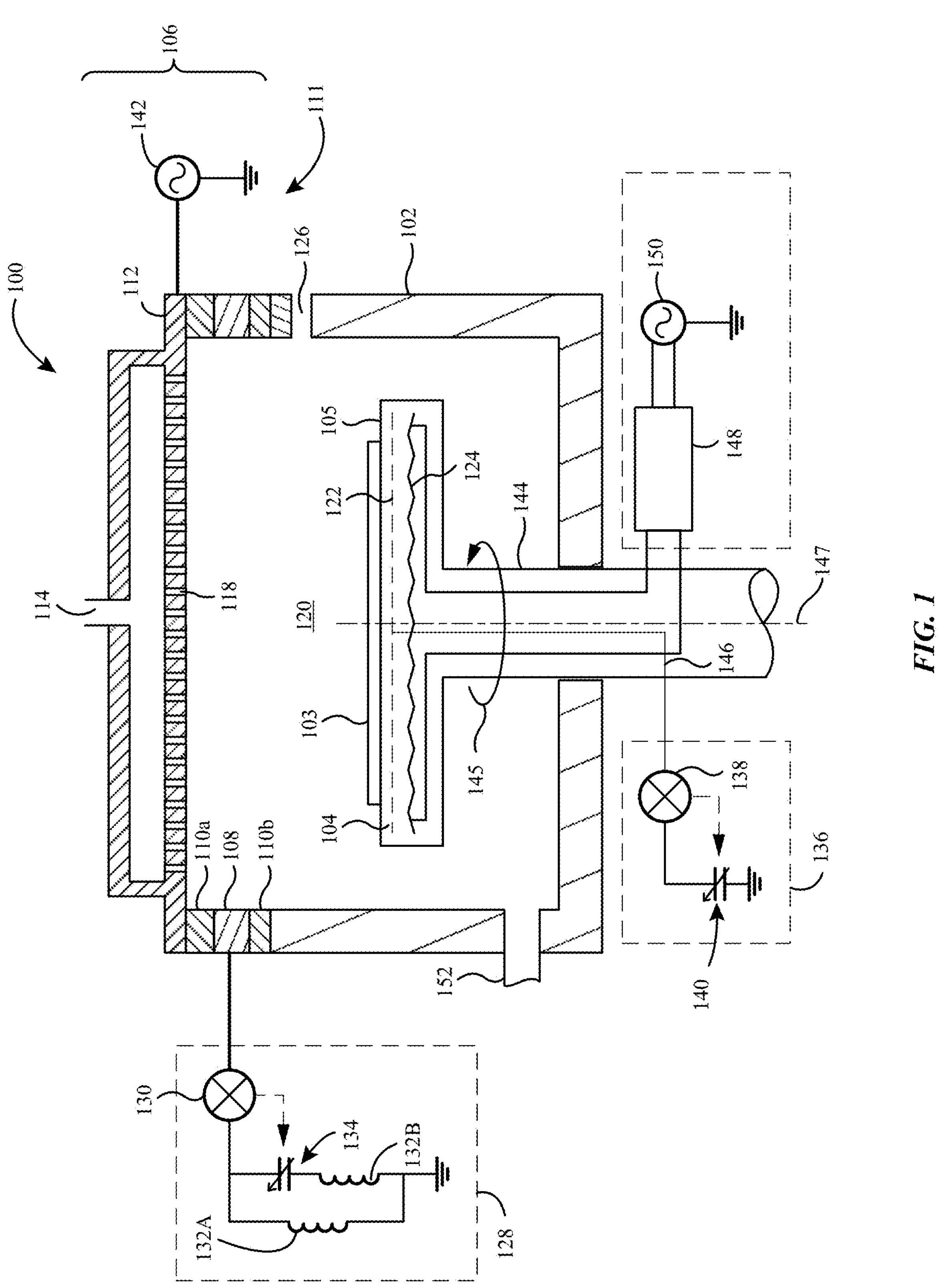
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, may process options are modified from vertical to horizontal applications. During 3D NAND processing, stacks of placeholder layers and dielectric materials may form the inter-electrode dielectric or inter-poly dielectric ("IPD") layers. These placeholder layers may have a variety of operations performed to place structures before fully removing the material and replacing it with a metal. When the memory holes are formed, apertures may extend through all of the alternating layers of material before accessing the underlying substrate. Subsequent processing may form a staircase structure for contacts, and may also exhume the placeholder materials laterally, and form a conductive material within the recesses.

As 3D NAND structures grow in the number of cells being formed, the aspect ratios of memory holes and other structures increase, sometimes dramatically. The growth in the number of cells being formed may result in the degradation of string currents. Furthermore, small threshold voltage variations may require reduced thicknesses of polycrystalline silicon channels formed in memory holes. When forming polycrystalline silicon channels, a reduced thickness of the deposited silicon material may result in a reduction in string current. Furthermore, with the increased number of inter-electrode dielectric and IPD layers, string current may further be sacrificed.

Conventional technologies may struggle with balancing properties associated with polycrystalline silicon channel thickness. With decreased thickness, less defect variability occurs which leads to a decreased threshold voltage variation. However, as previously discussed, decreased thickness also results in a reduced string current. The present technology overcomes these issues by adjusting the materials used in forming the polycrystalline silicon channels, which may reduce the tradeoff in electrical properties when reducing the thickness of the polycrystalline silicon channels. For example, the present technology may employ a three-part layer of material when forming the polycrystalline silicon channels. Instead of only using amorphous material, the present technology may deposit an intermediate layer of halogen-doped material between two layers of amorphous material. By using halogen-doped material, the halogen may improve electrical characteristics by passivating trap states and improving carrier mobility, thus increasing string current compared to conventional technologies.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

FIG. 1 shows a cross-sectional view of an exemplary semiconductor processing chamber system 100 according to some embodiments of the present technology. Semiconductor processing chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110*a*, 110*b*, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a faceplate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
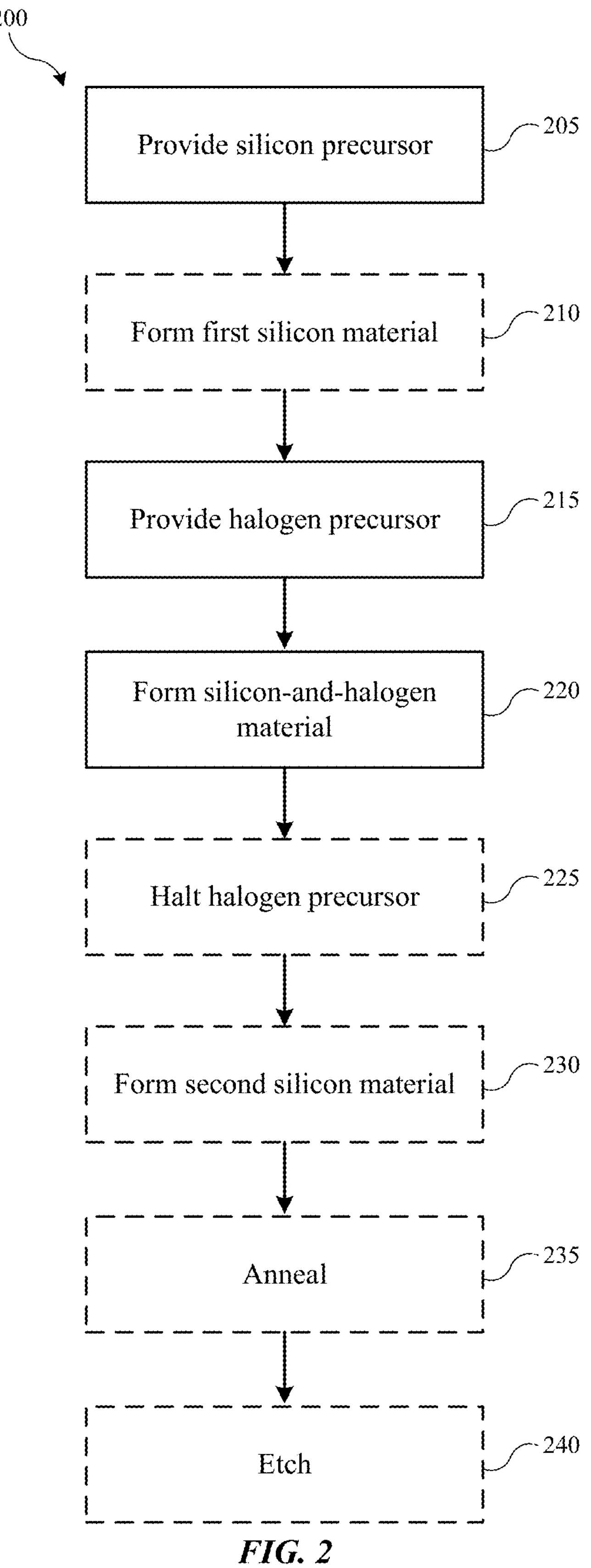
FIG. 2 shows selected operations in a formation method according to some embodiments of the present technology.

FIG. 2 shows operations of an exemplary method 200 of semiconductor processing according to some embodiments of the present technology. The method may be performed in a variety of processing chambers, including the semiconductor processing chamber 100 described above, as well as any other chamber in which plasma deposition may be performed. Method 200 may include a number of optional operations prior to imitation of the method 200, including front-end processing, deposition, etching, polishing, cleaning, or any other operations that may be performed prior to the described operations. For example, the method may begin after a number of pairs of layers have been deposited for producing 3D NAND memory.

Method 200 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 200 describes operations shown schematically in FIGS. 3A-3D, the illustrations of which will be described in conjunction with the operations of method 200. It is to be understood that FIGS. 3A-3D illustrate only partial schematic views, and a substrate may contain any number of structural sections having aspects as illustrated in the figures, as well as alternative structural aspects that may still benefit from operations of the present technology.

Figure 3A:
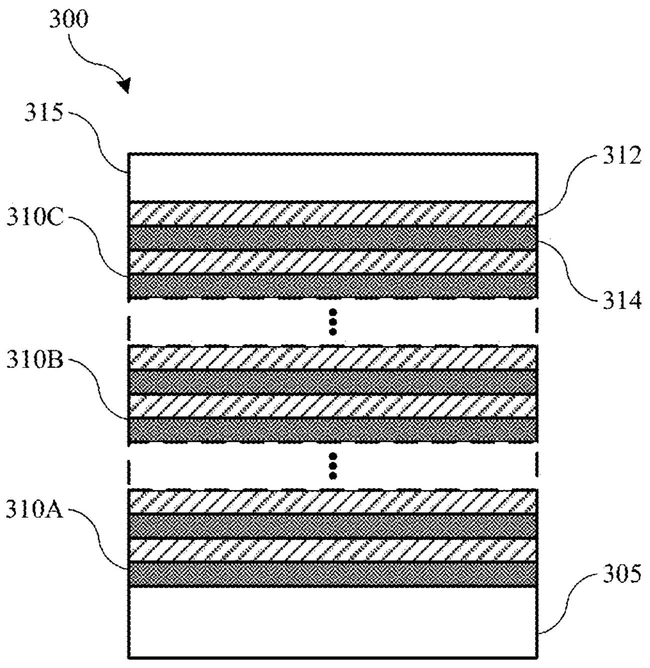
FIGS. 3A-3D shows show exemplary schematic cross-sectional structures in which material layers are included and produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structures on which a selective deposition material may be formed. As illustrated in FIG. 3A substrate 305 may have a number of layers of material deposited overlying the substrate. Substrate 305 may have a substantially planar surface or an uneven surface in embodiments. The substrate 305 may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, sapphire, or other substrate materials. The substrate 305 may have various dimensions, such as 200 mm or 300 mm diameter wafers, as well as rectangular or square panels.

Structure 300 may illustrate a partial view of a stack of alternating layers of materials, which in some embodiments may be used in 3D NAND memory formation. The alternating layers of material may be produced by any number of methods, including plasma-enhanced chemical vapor deposition, physical vapor deposition, atomic layer deposition, thermally enhanced chemical vapor deposition, or any other formation technique. In some embodiments, plasma-enhanced chemical vapor deposition may be performed in a processing chamber, such as processing chamber 100 described previously. Although the remaining disclosure will generally discuss stacks of alternating layers of oxide and nitride, embodiments of the present technology may use different combinations of materials, such as silicon oxide and silicon nitride, silicon oxide and silicon, silicon nitride and silicon, silicon and doped silicon, or any number of other materials. Additionally, any number of layers of material may be produced in a stack, or any portion of any stack, and different portions of a stack may include more, less, or similar numbers of layers of any other portion of a stack according to embodiments of the present technology.

As illustrated in FIG. 3A, structure 300 may include a substrate 305 having a stack of alternating layers of material. The illustrated stack may include a number of portions 310, which may each include at least one layer of oxide material 312, and at least one layer of nitride material 314. Each portion may also include multiple pairs of layers including greater than or about 2 pairs, greater than or about 10 pairs, greater than or about 50 pairs, greater than or about 100 pairs, or more pairs of layers. In total, the structure 300 may include at least 16 layers of alternating layers of the oxide material 312 and the nitride material 314, and may include at least 32 layers, at least 64 layers, at least 128 layers, or more. Any specific number of pairs encompassed by any of these stated ranges is to be understood as if specifically stated here. Although three portions, 310A, 310B, and 310C are illustrated, more or less portions may be included according to some embodiments of the present technology.

Figure 3B:
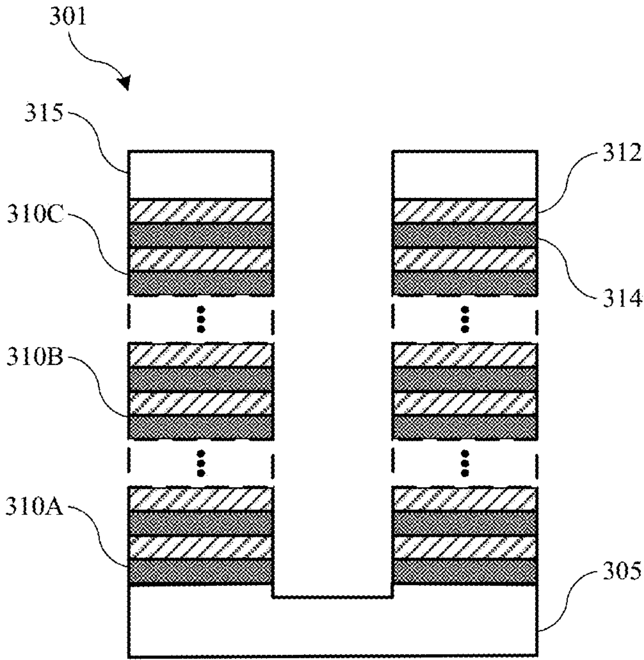

In some embodiments, multiple portions 310, including all portions 310, may be formed during a single deposition sequence. Additionally, in some embodiments the portions may be produced in multiple operations. A mask material 315 may be formed over any of the portions of the stack prior to forming a portion of a memory hole or other feature through the structure. As illustrated in FIG. 3B, once the layers have been formed, and a mask material 315 is deposited on the structure, memory holes may be etched through the structure. The etch process may be any type of etching, and in some embodiments may be or include a reactive-ion etch process. The etching operation may extend through the third portion 310C of the stack, the second portion 310B of the stack, and at least partially through the third portion 310A of the stack. Structures according to the present technology may be characterized by any aspect ratios or the height-to-width ratio of the structure, although in some embodiments the materials may be characterized by larger aspect ratios. For example, in some embodiments the aspect ratio of exemplary structures, such as the depth of the aperture or memory hole relative to the cross-sectional diameter, may be greater than or about 10:1, greater than or about 20:1, greater than or about 30:1, greater than or about 40:1, greater than or about 50:1, or greater.

Figure 3C:
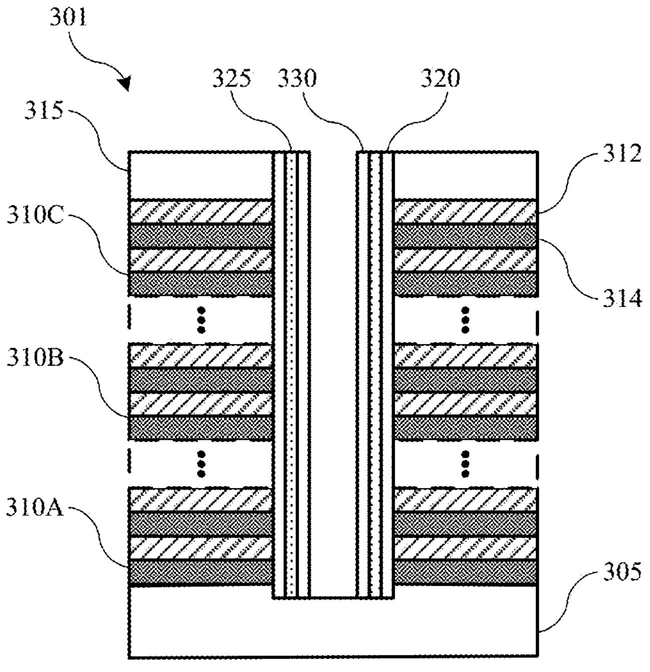

Referring to FIG. 3C, the method 200 may include providing a silicon-containing precursor to the processing region of the semiconductor processing chamber at operation 205. Silicon-containing precursors that may be used may include, but are not limited to, silane ($SiH_4$), disilane ($Si_2H_6$), trisilane ($Si_3H_8$), silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. In embodiments, the method 200 may also include forming a plasma of the silicon-containing precursor in the processing region. In embodiments, the plasma of the silicon-containing precursor may be formed by providing RF power to the faceplate to generate a plasma within the processing region, although any other processing chamber capable of producing plasma may similarly be used.

The method 200 may include forming a first silicon-containing material 320 on the substrate at optional operation 210. The first silicon-containing material 320 may be referred to simply as a first layer of material. The first layer of material may include a silicon-containing material, such as amorphous silicon. The first layer of material may include other constituents and may not be a pure silicon material. The first layer of material may extend into the one or more recesses formed in the alternating layers of material on the substrate 305. The first silicon-containing material 320 may reduce or prevent material, such as halogen material in a silicon-and-halogen-containing material discussed below, from entering the alternating layers of portions 310, such as the dielectric materials. If large amounts of halogen material enter the alternating layers of portions 310, devices may be damaged or ruined due to high leakage and/or instability.

After deposition of the first silicon-containing material 320 to a sufficient thickness, the method may include providing a halogen-containing precursor to the processing region of the semiconductor processing chamber at operation 215. The halogen-containing precursor may include fluorine, chlorine, bromine, or any other halogen, or combinations of halogens. Halogen-containing precursors that may be used may include, but are not limited to, nitrogen trifluoride ($NF_3$) and silicon tetrafluoride ($SiF_4$), as well as any other halogen-containing precursors that may be used in silicon-and-halogen-containing film formation. In embodiments, the method 200 may also include forming a plasma of the halogen-containing precursor in the processing region. As previously discussed, the plasma of the halogen-containing precursor may similarly be formed by providing RF power to the faceplate to generate a plasma within the processing region, although any other processing chamber capable of producing plasma may similarly be used. The halogen-containing precursor may be provided with the silicon-containing precursor. It is contemplated that the silicon-containing precursor provided with the halogen-containing precursor may be the same precursor or a different precursor provided at operation 205. It is also contemplated that the halogen-containing precursor may include sufficient silicon constituents, thus obviating the need for simultaneously providing a silicon-containing precursor with the halogen-containing precursor.

The method 200 may include forming a silicon-and-halogen-containing material 325 on the substrate at operation 220. The silicon-and-halogen-containing material 325 may be referred to simply as a second layer of material. The second layer of material may include a silicon-and-halogen-containing material. In embodiments, the silicon-and-halogen-containing material may include a silicon-and-fluorine-containing material, a silicon-and-chlorine-containing material, a silicon-and-bromine-containing material, or any other halogen material. The silicon-and-halogen-containing material 325 may extend into the one or more recesses formed in the alternating layers of material. The silicon-and-halogen-containing material 325 may overly the first silicon-containing material 320.

In embodiments, the method 200 may include reducing or halting a flow of the halogen-containing precursor subsequent to forming the silicon-and-halogen-containing material 325 at operation 225. A flow of the silicon-containing precursor from operation 205 may maintained, increased, or resumed if reduced or paused during operations 215 and 220. The silicon-containing precursor used to form the first silicon-containing material 320 may be the same precursor used to form a second silicon-containing material 330, as will be discussed further below. However, it is contemplated that different silicon-containing precursors may be used to form the first silicon-containing material 320 and the second silicon-containing material 330.

The method 200 may include forming the second silicon-containing material 330 at optional operation 230. The second silicon-containing material 330 may be referred to simply as a third layer of material. The third layer of material may include a silicon-containing material, such as amorphous silicon. The second layer of material may include other constituents and may not be a pure silicon material. The second silicon-containing material 330 may extend into the one or more recesses formed in the alternating layers of material. The second silicon-containing material 330 may overly the silicon-and-halogen-containing material 325. The second silicon-containing material 330 may protect the first silicon-containing material 320, the silicon-and-halogen-containing material 325, or both from moisture and oxygen. The second silicon-containing material 330 may serve as a protection layer that improves process stability.

Both the first silicon-containing material 320 and the second silicon-containing material 330 may have a substantially similar thickness. For example, the first silicon-containing material 320 and the second silicon-containing material 330 may be characterized by a thickness within about 5 nm of one another, and may have a thickness within about 4 nm of one another, within about 3 nm of one another, within about 2 nm of one another, within about 1 nm of one another, or less. In embodiments, the first layer of material, the second layer of material, or both may be characterized by a thickness less than or about 10 nm, such as less than or about 8 nm, less than or about 6 nm, less than or about 5 nm, less than or about 4 nm, less than or about 3 nm, or less.

The silicon-and-halogen-containing material 325 may be characterized by a thickness greater than a thickness of the first silicon-containing material 320 and the second silicon-containing material 330. In embodiments, the silicon-and-halogen-containing material 325 may be characterized by a thickness less than or about 60 nm. The thickness of the silicon-and-halogen-containing material 325 may be dependent on the desired amount of halogen material between the first silicon-containing material 320 and the second silicon-containing material 330. Accordingly, in embodiments, the silicon-and-halogen-containing material 325 may be characterized by a thickness less than or about 55 nm, such as less than or about 50 nm, less than or about 45 nm, less than or about 40 nm, less than or about 37 nm, less than or about 35 nm, less than or about 32 nm, less than or about 30 nm, less than or about 25 nm, less than or about 20 nm, less than or about 15 nm, less than or about 10 nm, less than or about 5 nm, less than or about 4 nm, less than or about 3 nm, or less.

The depositions at operations 210, 220, and 230 may be performed at chamber, substrate, or pedestal temperatures of less than or about 700° C. Consequently, in some embodiments the deposition may occur at temperatures less than or about 675° C., less than or about 650° C., less than or about 625° C., less than or about 600° C., less than or about 575° C., less than or about 550° C., less than or about 525° C., less than or about 500° C., less than or about 475° C., less than or about 450° C., less than or about 425° C., less than or about 400° C., less than or about 375° C., less than or about 350° C., less than or about 325° C., less than or about 300°

C., less than or about 275° C., less than or about 250° C., less than or about 225° C., less than or about 200° C., or lower.

Additionally, the depositions at operations 210, 220, and 230 may be performed at a pressure of less than or about 300 Torr, such as less than or about 280 Torr, less than or about 260 Torr, less than or about 240 Torr, less than or about 220 Torr, less than or about 200 Torr, less than or about 180 Torr, less than or about 160 Torr, less than or about 140 Torr, less than or about 120 Torr, less than or about 100 Torr, less than or about 80 Torr, less than or about 60 Torr, less than or about 40 Torr, less than or about 20 Torr, less than or about 15 Torr, less than or about 10 Torr, less than or about 7 Torr, less than or about 5 Torr, less than or about 3 Torr, or lower.

Operations 210, 220, and 230 may be formed at the same or similar process conditions. For example, the temperature and/or pressure may be maintained for each of the formation of the first silicon-containing material 320, the silicon-and-halogen-containing material 325, and the second silicon-containing material 330. Conversely, the temperature and/or pressure may be modified or adjusted between the formation of the first silicon-containing material 320, the silicon-and-halogen-containing material 325, and the second silicon-containing material 330.

Figure 3D:
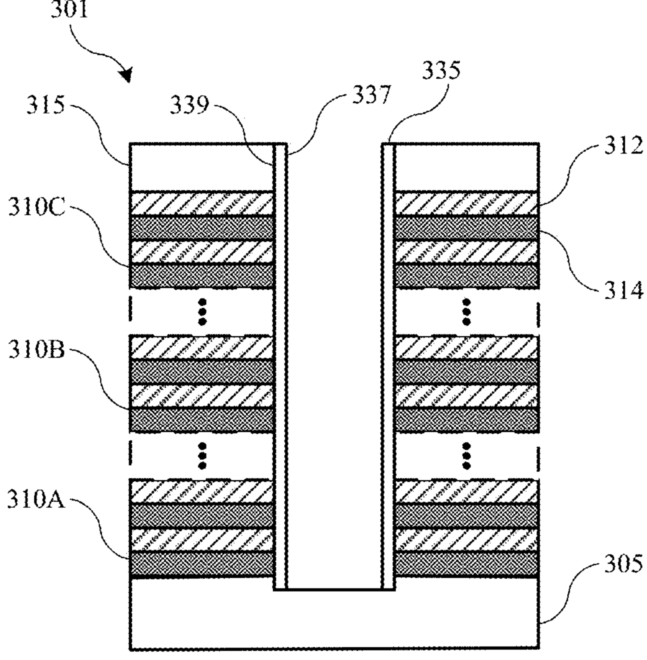

Referring to FIG. 3D, an optional anneal of the substrate 305 and the formed films may be performed at operation 235, which may raise the temperature of the formed films. The anneal may be performed subsequent to forming the second silicon-containing material 330. The anneal may include increasing the temperature of the structure 300 to greater than or about 500° C., and which may increase the temperature of the structure 300 to greater than or about 550° C., greater than or about 600° C., greater than or about 650° C., greater than or about 700° C., greater than or about 750° C., greater than or about 800° C., greater than or about 850° C., greater than or about 900° C., or higher. During the anneal, at least a portion of the first silicon-containing material 320 and the second silicon-containing material 330 may transition from, for example, amorphous silicon to polycrystalline silicon. During the anneal, greater than or about 95.0 vol. % of the amorphous silicon may transition to polycrystalline silicon, such as greater than or about 97.0%, greater than or about 99.0%, greater than or about 99.9%, or more. The polycrystalline silicon may include grains of crystalline silicon separated by regions of non-crystalline silicon, or grain boundaries. Depending on the depth of the channel, the polycrystalline silicon may include between one and about five grain boundaries. However, it is contemplated that the polycrystalline silicon, depending on dimensions, may include greater than five grain boundaries. Grain boundaries may act as scattering centers, which may reduce channel conductance and string current. Furthermore, a halogen material within the silicon-and-halogen-containing material 325 may diffuse into the first silicon-containing material 320 and the second silicon-containing material 330. Together, the first silicon-containing material 320, the silicon-and-halogen-containing material 325, and the second silicon-containing material 330 may be referred to as annealed material.

By incorporating the silicon-and-halogen-containing material 325 between the first silicon-containing material 320 and the second silicon-containing material 330, the halogen material may diffuse into the first silicon-containing material 320, the second silicon-containing material 330, or both during the anneal at operation 235. Depending on the conditions of the anneal at operation 235, the halogen material may uniformly distribute into the first silicon-containing material 320, the second silicon-containing material 330, or both. However, it is contemplated that the halogen material may not fully distribute uniformly and that a concentration gradient may be present between the silicon-and-halogen-containing material 325 and the first silicon-containing material 320, the second silicon-containing material 330, or both. When a concentration gradient is present, a higher concentration may be present where the silicon-and-halogen-containing material 325 was present prior to the anneal relative to where the first silicon-containing material 320, the second silicon-containing material 330, or both were present prior to the anneal. Due to the diffusion of halogen material into the polycrystalline silicon, thin film transistor properties of the polycrystalline silicon may be improved. The halogen may bond to silicon and passivate trap states in the silicon bandgap, thus forming a polycrystalline silicon channel with stronger bonding compared to conventional technologies. In conventional technologies, a greater amount of silicon in the polycrystalline silicon channel may be bonded with hydrogen, which has a lower bonding energy than silicon bonded with a halogen. The increased bonding energy between silicon and a halogen may reduce the trap state density via passivation, breaking the tradeoff between string current and threshold voltage variation in reduced thickness polycrystalline silicon channels. Furthermore, the increased bonding energy between silicon and a halogen may prolong the operational life of the device, as the bond is less likely to be destroyed by passing electrons during operation.

Subsequent to annealing the substrate, the method 200 may include removing a portion of annealed material 335, which may include the polycrystalline silicon material, at operation 240. As previously discussed, the annealed material 335 may include the first silicon-containing material 320, the silicon-and-halogen-containing material 325, and the second silicon-containing material 330. The process used to remove a portion of the annealed material 335 may be any type of etching, and in some embodiments may be or include a wet etch. With a thicker material being annealed, grain sizes within the annealed material 335, such as the polycrystalline silicon, may be larger and grain boundaries may be reduced. With larger grain sizes and, therefore, reduced grain boundaries, string current in final devices may be increased. If a thinner material is annealed, and an etch process to remove a portion of the annealed material is not necessary, grain sizes within the annealed material may be smaller, thereby sacrificing the conductive path and reducing string current. Furthermore, thinning of the channel through the removal of a portion of the annealed material 335 may improve threshold voltage variation as there may be less defect variability in a thinner channel.

Still referring to FIG. 3D, some embodiments of the present technology are directed to semiconductor structures. The structures, as previously discussed, may include a substrate 305 having alternating layers of material, such as oxide material 312 and nitride material 314, formed on the substrate 305. One or more recesses may be formed in the alternating layers of material. A polycrystalline silicon material 335 may extend into the one or more recesses. The polycrystalline silicon material 335 may include a first surface 337. A second surface 339 of polycrystalline material opposite the first surface 337 of the polycrystalline silicon material 335 may overly and contact the alternating layers of material. The polycrystalline silicon material 335 may include a halogen. A portion of the polycrystalline silicon material 335 disposed midway between the first surface 337 and second surface 339 may have a higher halogen atomic concentration compared to the first surface 337 and the second surface 339. For example, the portion of the polycrystalline silicon material 335 disposed midway between the first surface 337 and the second surface 339 may have a halogen concentration that is between about 1 at. % and about 5 at. % than the halogen concentration at the first surface 337 and/or the second surface 339. However, it is contemplated that the halogen concentration difference between the first surface 337 and/or second surface 339 and the portion of the polycrystalline silicon material 335 midway between the first surface 337 and the second surface 339 may be greater than or about 5 at. % The polycrystalline silicon material 335 may be characterized by a thickness of less than or about 30 nm, such as less than or about 28 nm, less than or about 26 nm, less than or about 24 nm, less than or about 22 nm, less than or about 20 nm, less than or about 18 nm, less than or about 16 nm, less than or about 14 nm, less than or about 12 nm, less than or about 10 nm, less than or about 8 nm, less than or about 6 nm, less than or about 4 nm, less than or about 2 nm, or less.

By utilizing one or more of the described processes, improved electrical performance in 3D NAND may be afforded, which may limit difficulties associated with scaling and increased layers in 3D NAND stacks. Consequently, improved fabrication may be afforded by the present technology, which may produce better performing devices over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the first layer of material" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor to a processing region of a semiconductor processing chamber, wherein a substrate is disposed within the processing region of the semiconductor processing chamber, wherein one or more recesses extend through alternating layers of material are formed on the substrate; and wherein an amorphous silicon material extends into the one or more recesses formed in the alternating layers of material;
providing a halogen-containing precursor to the processing region of the semiconductor processing chamber;
forming a halogen-doped silicon-containing material, wherein the halogen-doped silicon-containing material extends into the one or more recesses formed in the alternating layers of material and overlies the amorphous silicon material, and wherein the halogen-doped silicon-containing material is characterized by a thickness less than or equal to 60 nm.

2. The semiconductor processing method of claim 1, wherein a temperature within the semiconductor processing chamber is maintained at less than or equal to 700 ° C.

3. The semiconductor processing method of claim 1, wherein a pressure within the semiconductor processing chamber is maintained at less than or equal to 300 Torr.

4. The semiconductor processing method of claim 1, wherein the silicon-containing precursor comprises silane, disilane, dichlorosilane, or trisilane.

5. The semiconductor processing method of claim 1, wherein:
the halogen-containing precursor comprises fluorine; and
the halogen-doped silicon-containing material comprises a silicon-and-fluorine-containing material.

6. The semiconductor processing method of claim 1, wherein the halogen-containing precursor comprises nitrogen trifluoride or silicon tetrafluoride.

7. The semiconductor processing method of claim 1, further comprising:
forming a silicon-containing material, wherein the silicon-containing material overlies the halogen-doped silicon-containing material.

8. The semiconductor processing method of claim 1, wherein the halogen-doped silicon-containing material is characterized by a thickness less than or equal to 40 nm.

9. The semiconductor processing method of claim 7, further comprising:
annealing the substrate subsequent to forming the silicon-containing material.

10. The semiconductor processing method of claim 9, wherein:
a halogen material within the halogen-doped silicon-containing material diffuses into the amorphous silicon material, the silicon-containing material, or both during the annealing.

11. A semiconductor processing method comprising:
forming a first layer of material in one or more recesses defined in alternating layers of material on a substrate in a processing region of a semiconductor processing chamber, wherein the first layer of material is a first silicon-containing material;

subsequent to forming the first layer of material, forming a second layer of material on the first layer of material, wherein the second layer of material is a fluorine-doped silicon-containing material; and subsequent to forming the second layer of material, forming a third layer of material on the second layer of material, wherein the third layer of material is a second silicon-containing material;

annealing the substrate subsequent to forming the first layer of material, the second layer of material, and the third layer of material; and subsequent to annealing the substrate, removing a portion of the first silicon-containing material, the the fluorine-doped silicon-containing material, and the second silicon-containing material.

12. The semiconductor processing method of claim 11, wherein:

a temperature within the semiconductor processing chamber is maintained at less than or equal to 700° C.; and a pressure within the semiconductor processing chamber is maintained at less than or equal to 300 Torr.

13. The semiconductor processing method of claim 11, wherein:

the alternating layers of material comprise alternating layers of oxide material and nitride material; and the substrate comprises greater than 16 alternating layers of material.

14. The semiconductor processing method of claim 11, wherein the second layer of material is characterized by a thickness greater than a thickness of the first layer of material and the third layer of material.

15. The semiconductor processing method of claim 11, wherein the second layer of material is characterized by a thickness of between 2 nm and 30 nm.

16. The semiconductor processing method of claim 11, wherein:

the first layer of material, the third layer of material, or both comprise amorphous silicon; and the annealing causes at least a portion of the amorphous silicon to transition to a polycrystalline silicon.

17. A semiconductor structure comprising:

a substrate having alternating layers of material formed on the substrate; and wherein one or more recesses are formed in the alternating layers of material; and a polycrystalline silicon material extending into the one or more recesses, wherein a second surface of polycrystalline material opposite a first surface of the polycrystalline silicon material overlies the alternating layers of material, wherein the polycrystalline silicon material is doped with a halogen, wherein the polycrystalline silicon material is characterized by a thickness of less than or equal to 30 nm, and wherein a portion of the polycrystalline silicon material disposed midway between the first surface and second surface has a higher halogen atomic concentration compared to the first surface and the second surface.

18. The semiconductor structure of claim 17, wherein:

the polycrystalline silicon material is characterized by a thickness of less than or equal to 10 nm.

* * * * *